(12) United States Patent
Rudmann et al.

(10) Patent No.: US 11,005,001 B2
(45) Date of Patent: May 11, 2021

(54) OPTO-ELECTRONIC MODULES AND METHODS OF MANUFACTURING THE SAME AND APPLIANCES AND DEVICES COMPRISING THE SAME

(71) Applicant: AMS SENSORS SINGAPORE PTE. LTD., Singapore (SG)

(72) Inventors: Hartmut Rudmann, Jona (CH); Markus Rossi, Jona (CH)

(73) Assignee: ams Sensors Singapore Pte. Ltd., Singapore (SG)

(*) Notice: Subject to any disclaimer, the term of this patent is extended or adjusted under 35 U.S.C. 154(b) by 125 days.

(21) Appl. No.: 15/939,636

(22) Filed: Mar. 29, 2018

(65) Prior Publication Data
US 2018/0226530 A1    Aug. 9, 2018

Related U.S. Application Data

(62) Division of application No. 13/553,290, filed on Jul. 19, 2012, now Pat. No. 9,966,493.
(Continued)

(51) Int. Cl.
*H01L 31/16* (2006.01)
*H01L 27/146* (2006.01)
(Continued)

(52) U.S. Cl.
CPC ............ *H01L 31/16* (2013.01); *G01J 1/0209* (2013.01); *G01J 1/0233* (2013.01); *G01J 1/0271* (2013.01);
(Continued)

(58) Field of Classification Search
CPC ............ H01L 31/16; H01L 2924/0002; H01L 27/14627; H01L 27/14687;
(Continued)

(56) References Cited

U.S. PATENT DOCUMENTS

| 4,207,464 A | 6/1980 | Fukuyama et al. |
| 5,138,150 A | 8/1992 | Duncan |

(Continued)

FOREIGN PATENT DOCUMENTS

| CN | 1362621 | 8/2002 |
| CN | 1510496 A | 7/2004 |

(Continued)

OTHER PUBLICATIONS

Office Action in U.S. Appl. No. 13/923,565 (dated Sep. 9, 2013).
(Continued)

*Primary Examiner* — Seung C Sohn
(74) *Attorney, Agent, or Firm* — Michael Best and Friedrich LLP

(57) ABSTRACT

Manufacturing opto-electronic modules (1) includes providing a substrate wafer (PW) on which detecting members (D) are arranged; providing a spacer wafer (SW); providing an optics wafer (OW), the optics wafer comprising transparent portions (t) transparent for light generally detectable by the detecting members and at least one blocking portion (b) for substantially attenuating or blocking incident light generally detectable by the detecting members; and preparing a wafer stack (2) in which the spacer wafer (SW) is arranged between the substrate wafer (PW) and the optics wafer (OW) such that the detecting members (D) are arranged between the substrate wafer and the optics wafer. Emission members (E) for emitting light generally detectable by the detecting members (D) can be arranged on the substrate wafer (PW). Single modules (1) can be obtained by separating the wafer stack (2) into separate modules.

25 Claims, 3 Drawing Sheets

Related U.S. Application Data

(60) Provisional application No. 61/509,346, filed on Jul. 19, 2011.

(51) Int. Cl.
| | |
|---|---|
| *G02B 13/00* | (2006.01) |
| *H01L 25/16* | (2006.01) |
| *H01L 31/0232* | (2014.01) |
| *H01L 31/167* | (2006.01) |
| *G02B 3/00* | (2006.01) |
| *G01J 1/02* | (2006.01) |
| *G01J 5/04* | (2006.01) |
| *G01J 1/04* | (2006.01) |
| *G01J 1/06* | (2006.01) |
| *G01J 1/42* | (2006.01) |
| *G01J 5/00* | (2006.01) |
| *G01J 5/02* | (2006.01) |
| *G01J 5/20* | (2006.01) |
| *G01J 5/08* | (2006.01) |
| *B29D 11/00* | (2006.01) |

(52) U.S. Cl.
CPC ............ *G01J 1/0411* (2013.01); *G01J 1/06* (2013.01); *G01J 1/42* (2013.01); *G01J 5/00* (2013.01); *G01J 5/022* (2013.01); *G01J 5/024* (2013.01); *G01J 5/0235* (2013.01); *G01J 5/0265* (2013.01); *G01J 5/045* (2013.01); *G01J 5/0806* (2013.01); *G01J 5/20* (2013.01); *G02B 3/0056* (2013.01); *G02B 13/0085* (2013.01); *H01L 25/167* (2013.01); *H01L 27/14618* (2013.01); *H01L 27/14625* (2013.01); *H01L 27/14627* (2013.01); *H01L 27/14687* (2013.01); *H01L 31/02325* (2013.01); *H01L 31/167* (2013.01); *B29D 11/00298* (2013.01); *B29D 11/00307* (2013.01); *G01J 2001/061* (2013.01); *G02B 3/0031* (2013.01); *H01L 2924/0002* (2013.01); *Y10T 29/49002* (2015.01)

(58) Field of Classification Search
CPC ......... H01L 27/14625; H01L 27/14618; H01L 31/167; H01L 31/02325; H01L 25/167; G02B 13/0085; G02B 3/0056; G02B 3/0031; B29D 11/00307; B29D 11/00298; Y10T 29/49002; G01J 2001/061; G01J 5/0806; G01J 5/20; G01J 5/0265; G01J 5/024; G01J 5/0235; G01J 5/022; G01J 5/00; G01J 1/42; G01J 1/06; G01J 1/0411; G01J 5/045; G01J 1/0209; G01J 1/0233; G01J 1/0271; G01S 17/04
USPC ...................... 250/208.6, 221, 239
See application file for complete search history.

(56) References Cited

U.S. PATENT DOCUMENTS

| | | | | |
|---|---|---|---|---|
| 5,291,038 | A * | 3/1994 | Hanamoto | H01L 31/0203 257/82 |
| 5,912,872 | A | 6/1999 | Feldman et al. | |
| 6,381,072 | B1 * | 4/2002 | Burger | G02B 3/0056 359/621 |
| 6,503,126 | B1 | 8/2003 | Yamada et al. | |
| 7,121,744 | B2 | 10/2006 | Yamauchi et al. | |
| 7,505,121 | B2 | 3/2009 | Yamaguchi | |
| 7,995,189 | B2 | 8/2011 | Yamaguchi et al. | |
| 8,217,482 | B2 * | 7/2012 | Basoor | G01S 17/04 257/436 |
| 8,274,599 | B2 * | 9/2012 | Gustavsson | G02B 13/0015 257/433 |
| 8,536,671 | B2 * | 9/2013 | Liu | H01L 23/481 257/433 |
| 8,582,022 | B2 * | 11/2013 | Rudmann | H01L 27/14623 348/373 |
| 8,779,361 | B2 * | 7/2014 | Costello | G01D 5/34715 250/216 |
| 2004/0256349 | A1 | 12/2004 | Leib et al. | |
| 2005/0202826 | A1 | 9/2005 | Yuang | |
| 2006/0226452 | A1 | 10/2006 | Yamaguchi | |
| 2008/0290435 | A1 * | 11/2008 | Oliver | B29D 11/00375 257/432 |
| 2009/0219632 | A1 | 9/2009 | Kang et al. | |
| 2010/0327164 | A1 | 12/2010 | Costello et al. | |
| 2011/0013292 | A1 | 1/2011 | Rossi et al. | |
| 2011/0024627 | A1 | 2/2011 | Yao | |
| 2011/0043923 | A1 | 2/2011 | Rossi et al. | |
| 2011/0050979 | A1 | 3/2011 | Rudmann | |
| 2011/0121181 | A1 | 5/2011 | Costello et al. | |
| 2011/0297831 | A1 | 12/2011 | Yao et al. | |
| 2012/0026093 | A1 | 2/2012 | Duparre et al. | |
| 2012/0104454 | A1 | 5/2012 | Coffy | |
| 2012/0132809 | A1 | 5/2012 | Findlay | |
| 2013/0284906 | A1 | 10/2013 | Rudmann et al. | |

FOREIGN PATENT DOCUMENTS

| | | |
|---|---|---|
| CN | 1875617 A | 12/2006 |
| JP | 2004110069 | 4/2004 |
| JP | 2005072662 | 3/2005 |
| JP | 2011507284 A | 3/2011 |
| WO | 2003/019617 | 6/2003 |
| WO | 2009/076788 | 6/2009 |
| WO | 2009/139029 | 11/2009 |
| WO | 2010/033211 | 3/2010 |
| WO | 2010/081652 | 7/2010 |

OTHER PUBLICATIONS

Intellectual Property Office of Singapore, Examination Report and Search Report in Appln. No. 201305664-3 (Mar. 25, 2014).
State Intellectual Property Office of the People's Republic of China, Search Report in Patent Appn. No. 20130373268.5 (dated May 25, 2015).
State Intellectual Property Office of China, Search Report issued in Chinese Application Serial No. 201280006331.5, 1 page (dated Nov. 10, 2015) (and English translation).

* cited by examiner

OPTO-ELECTRONIC MODULES AND METHODS OF MANUFACTURING THE SAME AND APPLIANCES AND DEVICES COMPRISING THE SAME

CROSS-REFERENCE TO RELATED APPLICATION(S)

This application is a divisional of U.S. application Ser. No. 13/553,290, filed on Jul. 19, 2012, which claims priority from U.S. Provisional Patent Application No. 61/509,346, filed on Jul. 19, 2011, the contents of which are incorporated herein by reference.

TECHNICAL FIELD

This disclosure relates to the field of opto-electronics and more specifically to the packaging and manufacturing of opto-electronic components. More particularly, it relates to opto-electronic modules and to methods of manufacturing the same and to appliances and to electronic devices comprising such modules, in particular wherein the modules comprise at least one light detector.

BACKGROUND

From US 2010/0327164 A1, an opto-electronic module, more specifically a proximity sensor is known, during the manufacture of which light emitter dice and light detector dice are overmolded using transfer molding techniques so as to form lenses on these dice.

In U.S. Pat. No. 5,912,872, an integrated optical apparatus is presented. In the manufacture thereof, a support wafer having a plurality of active elements thereon is aligned with a transparent wafer having a corresponding plurality of optical elements. Such a support-transparent wafer pair may then be diced apart.

In US 2011/0050979 A1, an optical module for an electro-optical device with a functional element is disclosed. The optical module includes a lens substrate portion with at least one lens element, and a spacer. The spacer serves to keep the lens substrate at a well-defined axial distance from a base substrate portion of the fully assembled electro-optical device. In order to ensure an improved performance of the functional element, an EMC shield is provided. The spacer is at least in parts electrically conductive and thus forms the EMC shield or a part thereof. A method of manufacturing a plurality of such modules on a wafer scale is also disclosed in US 2011/0050979 A1.

DEFINITION OF TERMS

"Active optical component": A light sensing or a light emitting component. E.g., a photodiode, an image sensor, an LED, an OLED, a laser chip.

"Passive optical component": An optical component redirecting light by refraction and/or diffraction and/or reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, molding.

"Wafer": A substantially disk- or plate-like shaped item, its extension in one direction (z-direction or vertical direction) is small with respect to its extension in the other two directions (x- and y-directions or lateral directions). For example, on a (non-blank) wafer, a plurality of like structures or items are arranged or provided therein, e.g., on a rectangular grid. A wafer may have opening or holes, and a wafer may even be free of material in a predominant portion of its lateral area. Although in many contexts, a wafer is understood to be prevailingly made of a semiconductor material, in the present patent application, this is explicitely not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

SUMMARY

Some implementations provide one or more of the following advantages. For example, some implementations create an alternative way of manufacturing opto-electronic modules. More particularly, a particularly fast way of manufacturing opto-electronic modules and/or a particularly simple way of manufacturing opto-electronic modules can be provided. In addition, the respective opto-electronic module, an electronic device comprising such an opto-electronic module and an appliance comprising a multitude of such opto-electronic modules can be provided.

Also, some implementations provide opto-electronic modules having a particularly accurate alignment and a corresponding manufacturing method.

Further, some implementations provide opto-electronic modules of particularly small dimensions.

Some implementations provide opto-electronic modules comprising at least an active and possibly also a passive optical component which are well protected against stray light and/or cross-talk.

Also, some implementations provide particularly small electronic devices comprising at least one opto-electronic module.

According to one aspect, for example, a method for manufacturing opto-electronic modules comprises:
a) providing a substrate wafer on which a multitude of detecting members are arranged;
b) providing a spacer wafer;
c) providing an optics wafer, the optics wafer comprising a multitude of transparent portions transparent for light generally detectable by the detecting members and at least one blocking portion for substantially attenuating or blocking incident light generally detectable by the detecting members;
d) preparing a wafer stack in which the spacer wafer is arranged between the substrate wafer and the optics wafer such that the detecting members are arranged between the substrate wafer and the optics wafer.

This may allow manufacturing of opto-electronic modules in a particularly efficient way, and may allow manufacturing of particularly small opto-electronic modules. Furthermore, light incident on such a detecting member may be restricted to desired light, and undesired light, i.e. light which should not reach the detecting member, may be kept from reaching the detecting member, as it may be absorbed by and/or reflected by the blocking portion. For this purpose, the at least one blocking portion may be at least substantially non-transparent for light detectable by the detecting members.

The feature that the detecting members are arranged "between" the substrate wafer and the optics wafer is to be understood to comprise and to more precisely mean, respectively, the case that the detecting members are comprised in the substrate wafer and that there exists at least another portion of the substrate wafer such that the detecting members are arranged between that other portion of the substrate wafer and the optics wafer.

In case the detection members are comprised in the substrate wafer, one could rather and more clearly say that the wafer stack (cf. step d)) is prepared such that the detection members are arranged "on a side of the substrate facing the optics member", instead of arranged "between the substrate wafer and the optics wafer".

Nevertheless, the detection members may be comprised in the substrate wafer or be not comprised in the substrated wafer.

It is to be noted that the transparency of the transparent portions for light generally detectable by the detecting members does not necessarily mean that the transparent portions have to be transparent for any light generally detectable by the detecting members. In some implementations, a transparency for a portion of the light generally detectable by the detecting members is sufficient.

Particularly, the substrate wafer is a wafer referred to as substrate wafer, and the spacer wafer is a wafer referred to as spacer wafer, and the optics wafer is a wafer referred to as optics wafer.

The detecting member is a detector for detecting light, in particular infrared light, more particularly near-infrared light.

In some implementations, each of the wafers has a generally plate-like shape and comprises a two-dimensional periodic arrangement of structures or items.

In some embodiments, the detecting member is or comprises a photodiode.

In some embodiments, which may be combined with the before-addressed embodiment, step d) comprises fixing the substrate wafer to the spacer wafer and fixing the spacer wafer to the optics wafer. The fixing may in one or both cases be accomplished by gluing.

In some embodiments, which may be combined with one or both before-addressed embodiments, step d) comprises aligning the substrate wafer and the optics wafer such that each of the multitude of detecting members is aligned with respect to at least one of the transparent portions, in particular wherein each of the detecting members is aligned in the same way to one of the transparent portions each.

In some embodiments, which may be combined with one or more of the before-addressed embodiments, step a) comprises the step of
  a1) placing the detecting members on the substrate wafer by pick-and-place.

Carrying out such a pick-and-place operation on wafer-level allows to achieve a high placing accuracy and a high manufacturing speed.

In some embodiments, which may be combined with one or more of the before-addressed embodiments, step a) comprises the step of
  a2) electrically connecting each of the detection members to the substrate wafer.

This can be accomplished, e.g., by die-bonding or by soldering by reflowing.

In some embodiments, which may be combined with one or more of the before-addressed embodiments, each of the multitude of transparent portions comprises at least one passive optical component.

In some embodiments, which may be combined with one or more of the before-addressed embodiments, the method comprises providing a wafer which is a combination of the spacer wafer and the optics wafer. Such a wafer can be referred to as "combined optics wafer".

In some embodiments, which may be combined with one or more of the before-addressed embodiments, the method comprises the step of manufacturing the blocking portion and the spacer wafer as a unitary part. This may, for example, be accomplished using replication.

Combining wafers (and, correspondingly, the respective members) can be accomplished with relatively few manufacturing steps and, in particular, with relatively few alignment steps. This may simplify manufacture and/or result in modules of higher precision.

In some embodiments, which may be combined with one or more of the before-addressed embodiments, each of the multitude of transparent portions comprises at least one passive optical component such as a lens member (as an example for a passive optical component), in particular wherein each of the passive optical components comprises at least one optical structure, or more particularly, wherein each of the lens members comprises at least one lens element. Such a lens member is or comprises at least one (optical) lens; and such a lens element is a lens which possibly is a portion of a composed lens composed of at least two transparent parts. The lens elements are provided for redirecting light by diffraction or by refraction. More generally, the passive optical component are provided for redirecting light by diffraction and/or by refraction and/or by reflection.

In some embodiments, referring to the before-addressed embodiment comprising lens elements, the lens elements are or at least each of a portion of the lens elements is of generally convex shape. Also, partially or generally concave shapes or other shapes, e.g., combining concave and convex regions, are possible.

In some embodiments, referring to one or more of the before-addressed embodiments comprising passive optical components, each of the passive optical components or each of a portion of the passive optical components is associated with at least one of the detecting members each.

In some embodiments referring to one or more of the before-addressed embodiments comprising lens members, each of the lens members or each of a portion of the lens members is associated with at least one of the detecting members each.

In some embodiments, referring to one or more of the before-addressed embodiments comprising passive optical components (such as lens members), the method comprises the step of
  c1) manufacturing the passive optical components by means of replication.

Replication can be a very efficient way of producing a multitude of, e.g., lenses and lens elements, respectively. It may be possible to save many alignment steps and/or a lot of manufacturing time this way.

In some embodiments, referring to the before-addressed embodiment, step c1) comprises replicating a surface in a liquid, viscous or plastically deformable material and subsequently hardening, in particular curing, the material. Suitable materials can be, e.g., polymers such as epoxy resins.

In some embodiments, referring to the before-addressed embodiment, replicating the surface comprises embossing the surface into the material.

In some embodiments, referring to one or both of the two last-addressed embodiments, hardening the material is accomplished by at least one of heating and irradiating with light, in particular with ultraviolet light. In particular, the hardening can be curing.

In some embodiments, which may be combined with one or more of the before-addressed embodiments, the spacer wafer is made of a material which substantially attenuates or blocks light generally detectable by the detecting members. Using for the spacer wafer a material which is substantially non-transparent for light detectable by the detecting members can make it possible to shield the detecting members from undesired light such as stray light from outside the module or, if emission members are provided (see below), to prevent cross-talk from the emission members to the detecting members.

In some embodiments, referring to the before-addressed embodiment, a multitude of emission members for emitting light generally detectable by the detecting members is arranged on the substrate wafer, in particular, wherein the emission members are arranged such that a multitude of neighboring emission members and detecting members are present on the substrate wafer. In some cases, each of the emission members is associated with one of the detecting members.

With respect to the emission members and their emitted light spectrum, it is to be noted that the emission of light generally detectable by the detecting members does not mean that the emitted light necessarily has to cover the full wavelength range of light generally detectable by the detecting members, or that an (additional) emission of light not generally detectable by the detecting members would be excluded. For example, a transparency for a portion of the light generally detectable by the detecting members is sufficient. In some cases, an emission of light a portion of which falls into the wavelength range generally detectable by the detecting members is sufficient.

In some embodiments, referring to one or both of the two last-addressed embodiments, the emission members are placed on the substrate wafer for emitting the light in a direction generally perpendicular to the extension of the substrate. This way, vertically propagating light is emitted which may, for example, run through one of the transparent portions.

In some embodiments, referring to one or more of the embodiments comprising the emission members, each of the passive optical components or each of a portion of the passive optical components is associated with one of the emission members each.

In some embodiments, referring to one or more of the embodiments comprising the emission members and lens members, each of the lens members or each of a portion of the lens members is associated with one of the emission members each.

In some embodiments, referring to one or more of the embodiments comprising the emission members, the multitude of passive optical components comprises one plurality of passive optical components associated with one of the emission members each and another plurality of passive optical components associated with one of the detecting members each. This way, modules comprising an emission member arranged below an associated passive optical component (e.g., lens member) and a detecting member arranged below an associated passive optical component (e.g., lens member; these lens members being not identical with the before-mentioned ones) can be manufactured.

In this disclosure, "below" refers to a generally vertical direction (with respect to the wafer extension).

In some embodiments, referring to one or more of the embodiments comprising the emission members, the spacer wafer is structured and arranged such that it reduces optical cross-talk between the emission members and the detecting members. This can allow reduction of optical cross-talk in the sense of reducing or nullifying the amount of light emitted by the emission member and detected by the detecting member which has reached the detecting member via an undesired optical path, e.g., having been scattered (in an undesired way) within the opto-electronic module or having reached the detecting member without having left the opto-electronic module. It can allow substantial attenuation or blocking of light emitted by the emission member which did not pass (two times) through the optics wafer.

In some embodiments, which may be combined with one or more of the before-addressed embodiments, the method comprises the step of
  h) obtaining the spacer wafer by means of a replication process.

This can make the manufacture of the modules particularly efficient. For example, the replication process can comprises an embossing step. As a material for the spacer wafer, a polymer-based material such as an epoxy resin, for example, a curable material, can be a suitable choice.

In some embodiments, which may be combined with one or more of the before-addressed embodiments, the material of which the optics wafer is substantially made in the blocking portion is a hardened hardenable material (in particular a cured curable material), e.g., a polymer-based material such as an epoxy resin.

In some embodiments, which may be combined with one or more of the before-addressed embodiments, the portion of the optics wafer in the blocking portion is obtained using a replication process.

In some embodiments, which may be combined with one or more of the before-addressed embodiments, the opto-electronic modules are proximity sensors.

In some embodiments, which may be combined with one or more of the before-addressed embodiments, the method comprises the step of
  e) providing the substrate wafer with solder balls on that side of the substrate sensor which is opposed to that side of the substrate member on which the detecting members are arranged.

It is also possible to provide a substrate wafer having contact pads not provided with solder balls.

This way, the manufactured modules can be readily used in the manufacture of electronic devices, e.g., it can be used as a surface mount device.

In some embodiments, which may be combined with one or more of the before-addressed embodiments, the method comprises the step of
  f) separating the wafer stack into a multitude of separate modules each comprising
    a portion of the substrate wafer;
    at least one of the detecting members;
    a portion of the spacer wafer;
    at least one of the transparent portions; and
    a portion of the blocking portion.

This way, separate opto-electronic modules are obtained in a very efficient way. The separating (e.g., dicing) can be accomplished by, e.g., by means of a mechanical tool such as a wafer saw or a punch cutter, or by means of a laser.

In some embodiments, which may be combined with one or more of the before-addressed embodiments, the method comprises the step of g) providing a baffle wafer arranged next to the optics wafer on that side of the optics wafer which is opposed to that side of the optics wafer on which the spacer wafer is arranged, the baffle wafer comprising a multitude of transparent regions;

wherein step d) is replaced by the step of d') preparing a wafer stack in which the spacer wafer is arranged between the substrate wafer and the optics wafer such that the detecting members are arranged between the substrate wafer and the optics wafer, and wherein the optics wafer is arranged between the baffle wafer and the spacer wafer.

By means of the baffle wafer, it is possible to limit an angular range within which light incident on the baffle layer can enter the modules and/or reach at least a portion of the multitude of detection members.

More particularly, the baffle wafer is a wafer referred to as baffle wafer.

In some cases, each of the transparent regions or each of a portion of the transparent regions is associated with at least one of the detecting members; and/or, if the emission members are provided, each of the transparent regions or each of a portion of the transparent regions is associated with at least one of the emission members.

The transparent regions can, e.g., be formed by holes through the baffle wafer and/or by material transparent for light generally detectable by the detecting members.

In some embodiments, referring to the last-addressed embodiment, the baffle wafer is partially or even substantially made of a resilient or of an elastically or plastically deformable material. E.g., a foam or a foam-like material can be used.

In some embodiments, which may be combined with one or both last-addressed embodiments, the material of which the baffle wafer is substantially made is a hardened hardenable material (in particular a cured curable material), e.g., a polymer-based material such as an epoxy resin. Note that it is possible to provide that in the hardened or cured state, the material is resilient.

In some embodiments, which may be combined with one or more of the three last-addressed embodiments, the baffle wafer is obtained using a replication process.

In some embodiments, which may be combined with one or more of the four last-addressed embodiments, the method comprises providing a wafer which is a combination of the baffle wafer and the optics wafer. Such a wafer can be referred to as "combined optics wafer".

In some embodiments, which may be combined with one or more of the five last-addressed embodiments, the method comprises the step of manufacturing the blocking portion and the baffle wafer as a unitary part. This may, for example, be accomplished using replication.

Combining wafers (and, correspondingly, the respective members) can be accomplished with relatively few manufacturing steps and, in particular, with relatively few alignment steps. This may simplify manufacture and/or result in modules of higher precision.

In some embodiments, which may be combined with one or more of the before-addressed embodiments, the substrate wafer substantially is a printed circuit board assembly, for example, a printed circuit board on which at least one active optical component is mounted. This way, the well-known techniques of printed circuit board fabrication can be used for the manufacture of the substrate wafer. A printed circuit board arrangement (PCBA) comprises a printed circuit board (PCB). It can be a printed circuit board or a printed circuit board with one or more electrical or electronic components mounted thereon, wherein the one or more components may be, for example, active optical components such as the detecting members and/or the emission members.

Contact areas for electrically contacting the detecting members and, if provided, the emission members, and contact areas electrically contacting the modules from the outside and electrical connections (vertically) across the substrate wafer can thus be readily provided.

According to another (second) aspect of the invention, an opto-electronic module comprises:

a substrate;

an optics member arranged generally parallel to the substrate;

a detecting member arranged between the substrate and the optics member, mounted on the substrate, for detecting light having passed through the optics member;

a separation member arranged between the substrate and the optics member;

wherein the optics member comprises at least one transparent portion transparent for light generally detectable by the detecting member and at least one blocking portion for substantially attenuating or blocking incident light generally detectable by the detecting member.

Such a module can provide a particularly good manufacturability and a particularly accurate and/or simple alignment of constituents, and it can be designed to be very small.

The detection member may, generally, be comprised in the substrate or be not comprised in the substrate. In case the detection member is comprised in the substrate, one could rather and more clearly say that the detection member is arranged "on a side of the substrate facing the optics member," instead of arranged "between the substrate and the optics member."

In some implementations, opto-electronic modules have features of the corresponding methods, and likewise, methods have features of the corresponding opto-electronic modules. Some specific examples of the modules are described below.

The advantages of the modules basically correspond to the advantages of corresponding methods and vice-versa.

In some embodiments of the module, the separation member is arranged beside the detecting member.

In some embodiments of the module, which may be combined with the before-addressed embodiment, the at least one blocking portion is made of a material which substantially attenuates or blocks light generally detectable by the detecting member. For example, the material can be a thermally cured material.

In some embodiments of the module, which may be combined with one or more of the before-addressed module embodiments, the substrate is a generally planar substrate.

In some embodiments of the module, which may be combined with one or more of the before-addressed module embodiments, the substrate is a generally plate-like substrate.

In some embodiments of the module, which may be combined with one or more of the before-addressed module embodiments, the optics member is a generally planar optics member (at least when disregarding possibly existing protruding lens member portions or protruding portions of other passive optical components).

In some embodiments of the module, which may be combined with one or more of the before-addressed module embodiments, the optics member is a generally plate-like optics member.

In some embodiments of the module, which may be combined with one or more of the before-addressed module embodiments, the separation member is a generally planar separation member.

In some embodiments of the module, which may be combined with one or more of the before-addressed module embodiments, the separation member is a generally plate-like separation member.

In some embodiments of the module, which may be combined with one or more of the before-addressed module embodiments, the separation member has one or more openings. For example, the detecting member can be arranged in one of these openings.

In some embodiments of the module which may be combined with one or more of the before-addressed module embodiments, the optics member and the separation member are combined in one member. In particular, the at least one blocking portion and the separation member are manufactured as a unitary part, e.g., using replication.

In some embodiments of the module, which may be combined with one or more of the before-addressed module embodiments, the detecting member is a packaged electrical component, e.g., an SMT device.

In some embodiments of the module, which may be combined with one or more of the before-addressed module embodiments, except for the last-addressed embodiment, the detecting member is an unpackaged electrical component, e.g., a flip chip or a chip attached to the substrate by wire-bonding.

In some embodiments of the module, which may be combined with one or more of the before-addressed module embodiments, the transparent portion comprising at least one passive optical component, or, more particularly, at least one lens member.

In some embodiments, referring to the before-addressed embodiment, the at least one passive optical component (or the at least one lens member) comprises at least one optical structure (or at least one lens element), wherein the at least one optical structure (or the at least one lens element) is at least one of made of a hardened hardenable material and obtained using a replication process. For example, the hardened hardenable material can be hardened by at least one of heating and irradiating with light, in particular ultraviolet light. More particularly, the hardening can be a curing. The replication process may comprise an embossing step.

In some embodiments of the module, which may be combined with one or more of the before-addressed module embodiments, the substrate and the optics member are fixed to each other via the separation member.

In some embodiments of the module, which may be combined with one or more of the before-addressed module embodiments, the separation member extends substantially from the substrate to the optics member.

In some embodiments of the module, which may be combined with one or more of the before-addressed module embodiments, the separation member is glued to the optics member and to the substrate, e.g., by means of a thermally curing glue, e.g., a suitable epoxy resin.

In some embodiments of the module, which may be combined with one or more of the before-addressed module embodiments, the substrate, the optics member and the separating member are of generally block- or plate-like shape, at least the separating member having at least one hole, in particular wherein the hole extends through the separating member. This way, it is possible that a particularly good manufacturability is achieved.

In some embodiments of the module, referring to the before-addressed embodiment, the detecting member is arranged within the hole.

In some embodiments of the module, which may be combined with one or more of the before-addressed module embodiments, wherein the substrate, the optics member and the separating member have rectangularly arranged outer surfaces.

In some embodiments of the module, which may be combined with one or more of the before-addressed module embodiments, lateral dimensions of
  the substrate;
  the optics member; and
  the separation member;
are substantially identical, in particular wherein the lateral dimensions of the module are substantially identical therewith.

The term lateral dimensions refers to dimensions measured substantially perpendicular to the direction in which the substrate and the separation member and the optics member are subsequently arranged. With the lateral outer dimensions of substrate, optics member and separation member being substantially identical, the manufacturability of the module is greatly enhanced.

In some embodiments of the module, which may be combined with one or more of the before-addressed module embodiments, the module comprises an emission member for emitting light generally detectable by the detecting member.

In some embodiments, referring to the before-addressed embodiment, at least a portion of the separation member is arranged between the emission member and the detecting member for reducing optical cross-talk between the emission member and the detecting member.

In some embodiments of the module, which may be combined with one or more of the before-addressed module embodiments, the detecting member is encircled by the separating member.

In some embodiments, referring to one or more of the before-addressed module embodiments comprising an emission member, the emission member is encircled by the separating member.

For example, a portion of side walls (circumferential side walls) of the module can be formed by the separation member.

In some embodiments, referring to one or more of the before-addressed embodiments comprising an emission member, the optics member comprises at least a first and a second lens members comprising at least one lens element each. In particular, it can be provided that the first and second lens members form a first and a second transparent portion, respectively, of the optics member, and more particularly, wherein the first and second lens members are surrounded by the blocking portion.

In some embodiments, referring to the last-addressed embodiment, viewed in a direction generally perpendicular to the substrate (vertical direction), the emission member and the first lens member are arranged one after the other, and the detecting member and the second lens member are arranged one after the other. Such a module can be very small and highly functional.

In some embodiments of the module, which may be combined with one or more of the before-addressed module embodiments, the emission member is a packaged electrical component, e.g., an SMT device.

In some embodiments of the module, which may be combined with one or more of the before-addressed module embodiments comprising an emission member, except for the last-addressed embodiment, the emission member is an unpackaged electrical component, e.g., a flip chip or a chip attached to the substrate by wire-bonding.

In some embodiments of the module, which may be combined with one or more of the before-addressed module embodiments comprising an emission member, the emission member, the optics member and the detecting member are structured and arranged such, that when light emitted from the emission member having passed the at least one transparent portion and having been reflected by a surface located outside the module and having passed the at least one transparent portion again is detected by the detecting member, an amount of the so-detected light depends on a distance of the surface to the optics member.

Therein, the surface located outside the module can be located near the optics member, e.g., in some applications, in a distance below 1 m, more particularly below 20 cm or even below 8 cm.

In some embodiments of the module, which may be combined with one or more of the before-addressed module embodiments, the separation member is made of a material which substantially attenuates or blocks light generally detectable by the detecting member. This can be particularly helpful when the separation member is provided for substantially attenuating or blocking light generally detectable by the detecting member, but incident from a side of the separation member opposed to a side of the separation member facing the detecting member, from being detected by the detecting member.

In some cases, the separation member is not a portion of the substrate and not a portion of the optics member. The separation member can be a unitary part In some embodiments of the module, which may be combined with one or more of the before-addressed module embodiments, the separation member is at least one of made of a hardened hardenable material and obtained using a replication process. More particularly, the hardening can be a curing. In particular, the hardened hardenable material (or cured curable) can be hardened (cured) by application of heat.

In some embodiments of the module, which may be combined with one or more of the before-addressed module embodiments, the at least one transparent portion is substantially made of a polymer-based material, e.g., of an epoxy resin, or in particular of a cured curable material.

In some embodiments of the module, which may be combined with one or more of the before-addressed module embodiments, the at least one blocking portion is substantially made of a polymer-based material, e.g., of an epoxy resin.

In some embodiments of the module, which may be combined with one or more of the before-addressed module embodiments, the substrate provides at least one electrical connection from the detection member across the substrate. This is an elegant way to electrically contact (from the outside) active optical components located within the module.

In some embodiments of the module, which may be combined with one or more of the before-addressed module embodiments, the substrate is a printed circuit board assembly. Since this printed circuit board assembly is a constituent of a package, namely of the module, it can also be referred to as an interposer with at least one active optical component mounted thereon. The printed circuit board (PCB) material may, e.g., be a rigid or a flexible PCB material, a fiber-reinforced or not fiber-reinforced material, it may be epoxy-based such as FR4 or polyimide. Active optical components may be mounted on the PCB, e.g., by means of wire bonding or soldering. The same applies also to the PCB of the PCB assembly possibly constituting the substrate wafer.

In some implementations, at least one of the detecting member and the emission member is electrically connected to the substrate member, wherein this can be accomplished, e.g., by soldering, by surface mount technology (SMT) or by flip-chip technology or by wire-bonding.

In some embodiments of the module, which may be combined with one or more of the before-addressed module embodiments, the module comprises a baffle member arranged next to the optics member on that side of the optics member which is opposed to that side of the optics member on which the separation member is arranged. The baffle member can be structured and arranged for protection from undesired light, in particular for protection of the detecting member from undesired light, and/or for functioning as an aperture.

In some embodiments of the module, referring to the last-addressed module embodiment, the baffle member is partially or even substantially made of a resilient or of an elastically or plastically deformable material. This can be helpful, e.g., when mounting the module. For example, when a module is arranged within a housing in mechanical contact to a window of the housing, mounting tolerances can be absorbed by a resilient baffle member, e.g., making the distance of a printed circuit board on which the module is mounted to the window less critical, the resilient baffle member accounting for variations in that distance by readily deforming and adjusting itself.

In some embodiments of the module, to be combined with one or both of the last-addressed module embodiments, the baffle member and the optics member are combined in one member; in particular, the at least one blocking portion and the spacer member are manufactured as a unitary part, e.g., using replication.

In some embodiments of the module, which may be combined with one or more of the before-addressed module embodiments, wherein the module is a proximity sensor.

An appliance can comprise a multitude of the modules. For example, the appliance can comprise a substrate wafer, an optics wafer, a spacer wafer, wherein the multitude of substrates is comprised in the substrate wafer, the multitude of optics members is comprised in the optics wafer, the multitude of separation members is comprised in the spacer wafer. The appliance can be considered a wafer stack. All the wafers can be generally planar and generally disk- or plate-shaped (in case of the optics wafer, at least when disregarding possibly existing protruding lens member portions (or more generally protruding portions of passive optical components)).

An electronic device can comprise a printed circuit board and a module mounted on the printed circuit board. For example, the device can be a hand-held communication device. The device could also can be a photographic device, such as a photo camera.

In another aspect (second aspect), of the invention, a method for manufacturing opto-electronic modules comprises:
- a') providing a substrate wafer on which a multitude of detecting members are arranged;
- b') providing a spacer wafer;
- c') providing an optics wafer; and
- d') preparing a wafer stack in which the spacer wafer is arranged between the substrate wafer and the optics wafer such that the detecting members are arranged between the substrate wafer and the optics wafer, wherein the substrate wafer substantially is a printed circuit board assembly.

Particular embodiments of this method are readily conceivable when combining this method with the methods described above, including or excluding the feature that the optics wafer comprises a multitude of transparent portions and at least one blocking portion.

Similarly, in this aspect of the invention, the following opto-electronic modules, appliances and electronic devices are comprised:

An opto-electronic module comprising
- a substrate substantially being a printed circuit board assembly;
- an optics member arranged generally parallel to the substrate;
- a detecting member arranged between the substrate and the optics member, mounted on the substrate, for detecting light having passed through the optics member; and
- a separation member arranged between the substrate and the optics member.

An appliance comprising a multitude of modules according to the foregoing aspect.

An electronic device comprising a printed circuit board and a module according to the foregoing aspect mounted on the printed circuit board.

Particular embodiments of these opto-electronic modules and appliances and electronic devices, respectively, according to the foregoing aspect are readily conceivable when combining these with the opto-electronic modules and appliances and electronic devices, respectively, described above, including or excluding the feature that the optics member comprises at least one transparent portion and at least one blocking portion.

It is to be noted that it is possible that a wafer ("combined optics wafer") is provided which is a combination of the described optics wafer and the described spacer wafer. Accordingly, then, the spacer wafer is optional, its properties and functions are fulfilled by an optics wafer which is structured and configured accordingly. This can be accomplished, e.g., by manufacturing as a unitary part: what is described above as spacer wafer and what is described above as at least one blocking portion. Analogously, a "combined optics wafer" can be provided which can be understood as a combination of the described optics wafer and the described baffle wafer. And, it is also possible to provide that the "combined optics wafer" can be understood as a combination of the described optics wafer and the described spacer wafer and the described baffle wafer.

Correspondingly, it is possible that a member is provided which is a combination of the described optics member and the described separation member. Accordingly, then, the separation member is optional, its properties and functions are fulfilled by an optics member which is structured and configured accordingly. This can be accomplished, e.g., by manufacturing as a unitary part: what is described above as separation member and what is described above as at least one blocking portion. An alternative or additional combination with the baffle member is, of course, also possible.

In other words, it applies to any of the disclosed embodiments that the spacer wafer and/or the baffle wafer (if at all present) may be comprised in the optics wafer or may be separated therefrom; and that the separation member and/or the baffle member (if at all present) may be comprised in the optics member or may be separated therefrom.

In accordance with another aspect, a method for manufacturing opto-electronic modules, the method comprises:
- A) providing a substrate wafer on which a multitude of detecting members are arranged;
- C) providing an optics wafer, the optics wafer comprising a multitude of transparent portions transparent for light generally detectable by the detecting members and at least one blocking portion for substantially attenuating or blocking incident light generally detectable by the detecting members; and
- D) preparing a wafer stack comprising the substrate wafer and the optics wafer.

Likewise, an opto-electronic module can comprise:
- a substrate;
- an optics member arranged generally parallel to the substrate; and
- a detecting member arranged between the substrate and the optics member, mounted on the substrate, for detecting light having passed through the optics member;

wherein the optics member comprises at least one transparent portion transparent for light generally detectable by the detecting member and at least one blocking portion for substantially attenuating or blocking incident light generally detectable by the detecting member.

Additional aspects, features and advantages of the invention will be readily apparent from the detailed description, the accompanying drawings and the claims.

BRIEF DESCRIPTION OF THE DRAWINGS

Below, examples of the invention are described in more detail with reference to the drawings. The figures show schematically.

The reference symbols used in the figures and their meaning are summarized in the list of reference symbols. The described embodiments are intended as examples.

DETAILED DESCRIPTION

Figure 1:
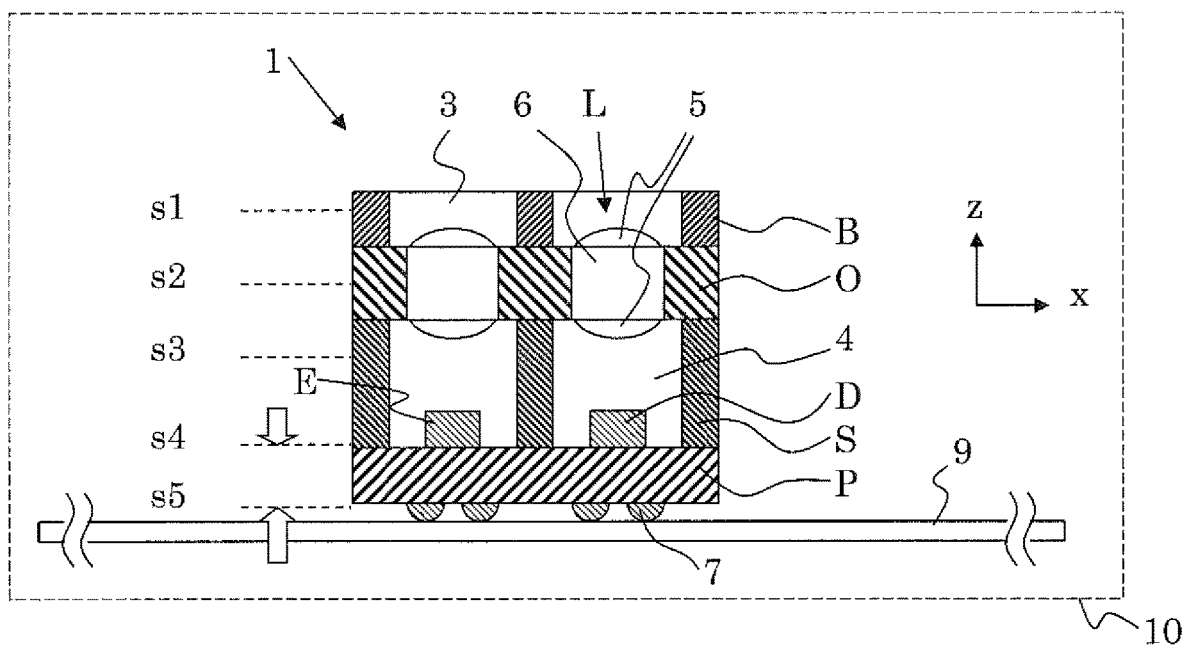
FIG. 1 a cross-sectional view of an opto-electronic module.
Figure 2:
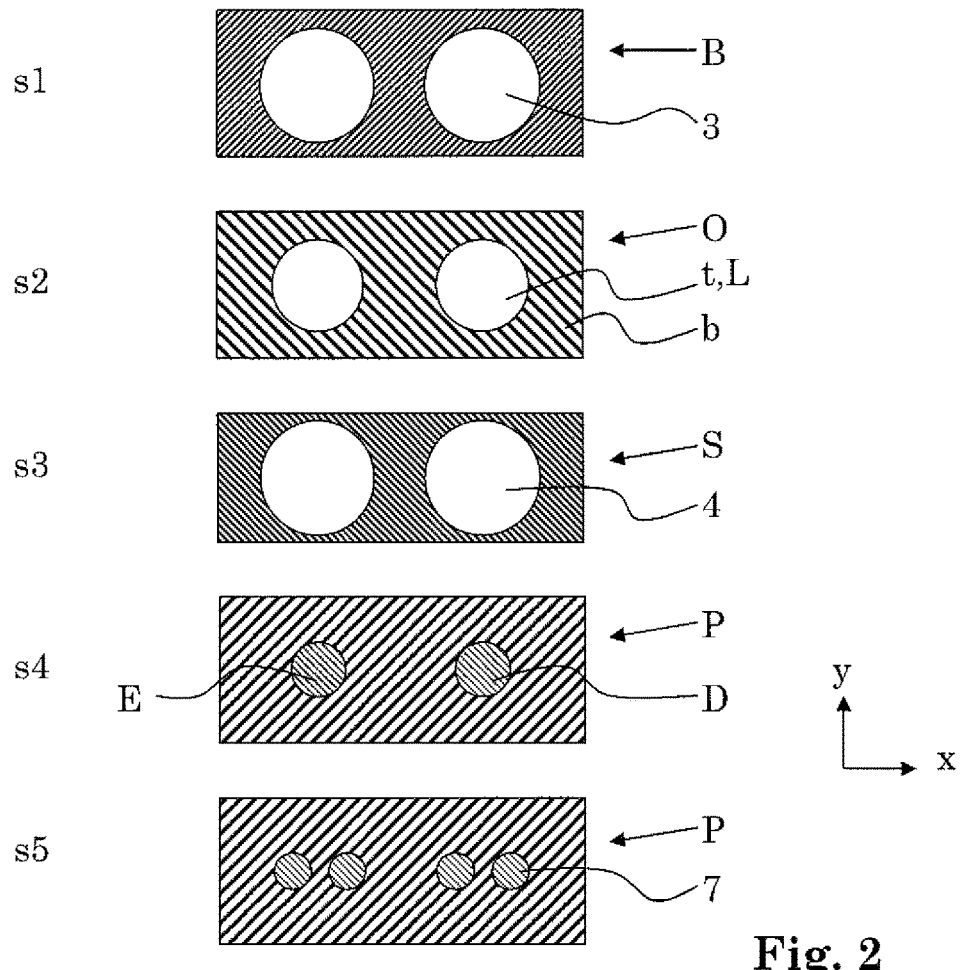
FIG. 2 various cross-sectional views of constituents of the module of FIG. 1.

FIG. 1 shows a schematic cross-sectional view of an opto-electronic module 1. The illustrated cross-section is a vertical cross-section. FIG. 2 shows various lateral schematic cross-sectional views of constituents of the module of FIG. 1, wherein the approximate positions of these lateral cross-sections are indicated in FIG. 1 by s1 to s5 and dashed lines. For s4 and s5, the direction of view is indicated by arrows.

Module 1 comprises several constituents (P, S, O, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a substrate P, a separation member S, an optics member O and a baffle member B stacked upon each other. Substrate P is, e.g., a printed circuit board assembly. The printed circuit board (PCB) of this PCB assembly can more specifically also be referred to as an interposer. On the PCB, an emission member E for emitting light, in particular infrared light (more particularly near-infrared light), can be mounted, e.g., a light-emitting diode; and a detecting member D can be mounted thereon, for detecting light, in particular infrared light (more particularly near-infrared light, e.g., a photo diode. Electrical contacts of emission member E and detecting member D are electrically connected to the outside of module 1, where solder balls 7 are attached. Instead of providing solder balls 7, it would also be possible to provide contact pads on the PCB which are not (or at a later time) provided with solder balls.

This way, module 1 can be mounted on a printed circuit board 9, e.g., in surface mount technology (SMT), next to other electronic components (not shown). Printed circuit board 9 may be a constituent of an electronic device 10 such as a hand-held communication device. In particular, device 10 can be a smart phone. Module 1 is particularly suitable for such an application because it can be manufactured having a particularly small size.

Separation member S has two openings 4, emission member E arranged in one of them and detecting member D being arranged in the other. This way, emission member E and detecting member D are laterally encircled by separating member S.

Separation member S may fulfill several tasks. It can ensure a well-defined distance between substrate P and optics member O (through its vertical extension) which helps to achieve well-defined light paths from emitting member E through optics member O and from the outside of module 1 through optics member O onto detecting member D. Separation member S can also provide protection of detecting member D from light that is not supposed to be detected by detection member D, by being substantially non-transparent to light generally detectable by detecting member D and by forming a portion of the outside walls of module 1. And, separation member S can also provide protection of detecting member D from light emitted by emitting member E which should not reach detecting member D, so as to reduce optical cross-talk between emission member E and detecting member E, by being substantially non-transparent to light generally detectable by detecting member D and by forming a wall between emission member E and detecting member D. Light reflected inside module 1 and stray light originating from emission member E can be kept from reaching detecting member D this way. Separating member S can be made of a polymer material, in particular of a hardenable or more specifically curable polymer material, e.g., of an epoxy resin.

Optics member O comprises a blocking portion b and two transparent portions t, one for allowing light emitted by emission member E to leave module 1, and another one for allowing light to enter module 1 from the outside of module 1 and reach detecting member D.

Blocking portion b is substantially non-transparent for light generally detectable by detecting member D, e.g., by being made of a suitable (polymer) material. Transparent portions t comprise a passive optical component L or, more particularly and as an example, a lens member L each, for light guidance. Lens members L may, e.g., comprise, as shown in FIG. 1, two lens elements 5 in close contact to a transparent element 6. Transparent elements 6 can have the same vertical dimension as optics member O where it forms blocking portion b, such that optics member O where it forms blocking portion b together with transparent elements 6 describes a (close-to-perfect) solid plate shape. Lens elements 5 redirect light by refraction (cf. FIG. 1) and/or by diffraction. E.g., they may all be of generally convex shape (as shown in FIG. 1), but one or more of lens elements 5 may be differently shaped, e.g., generally or partially concave.

Baffle member B allows to shield undesired light, in particular light leaving module 1 or incident to module 1 in an desired angle. For example, baffle member B can have two separate transparent regions 3 which may be embodied as openings or by means of transparent material. Baffle member B can, outside the transparent regions 3, be made of a material substantially attenuating or blocking light generally detectable by the detecting members, or it could be provided with a coating having such a property, wherein the latter can be more complex to manufacture. The shape of baffle member B or more precisely of the transparent regions 3, can be different from what is shown in FIGS. 1 and 2, e.g., describe cone-like shapes or describe a truncated pyramid.

The lateral shape not only of the transparent regions 3, but also of the transparent portions t and of the openings 4 do not have to be circular, but may have other appearances, e.g., polygonal or rectangular with rounded corners.

Module 1 is an opto-electronic component, more precisely a packaged opto-electronic component. The vertical side walls of module 1 are formed by items P, S, O and B. A bottom wall is formed by substrate P, and a top wall by baffle member B or by baffle member B together with optics member O.

As is well visible in FIG. 2, the four items P, S, O, B, which can for the reasons above also be referred to as housing components, all have substantially the same lateral shape and lateral dimensions. This is related to a possible and very efficient way of manufacturing such modules 1 which is described in more detail below referring to FIGS. 3 and 4. These housing components P, S, O, and B are all of generally block- or plate-like shape or more generally of generally rectangular parallelepiped shape, possibly having holes or openings (such as baffle member B and separation member S do) or projections (such as optics member O does).

The module 1 shown in FIG. 1 can be a proximity sensor. Such a module 1 would allow to detect whether or not an object is located within a predefined distance to the module, e.g., as judged from a photocurrent outputted by detecting member D, while emission member E would be emitting light, possibly in form of light pulses. For example, emission member E, optics member O and detecting member D could be arranged such, that a surface capable of reflecting light located within a predefined distance or distance range of optics member O could enable a detection by detecting member D of a sufficiently high intensity of light emitted by emission member E and reflected by the surface, whereas light emitted by emission member E and reflected by such a surface located farther away from optics member O and outside the predefined distance, respectively, would not cause a detection of high-enough light intensity by detecting member D.

It would also be possible to create a module which comprises (as electronic components) only a detecting member D and no emission member E. In that case, the module could be embodied substantially as the right half of the module 1 shown in FIGS. 1 and 2.

Furthermore, it is possible to provide modules which are designed according to the same principles as discussed above, but comprising, in addition to detecting member D, one or more additional electronic components such as additional light detectors, or one or more integrated circuits, or two or more light sources.

The active electronic components comprised in a module (such as emission member E and detecting member D in the example of FIG. 1) can be packaged or unpackaged electronic components. For contacting substrate P, technologies such as wire-bonding or flip chip technology or any other known surface mount technologies may be used, or even conventional through-hole technology.

Figure 3:
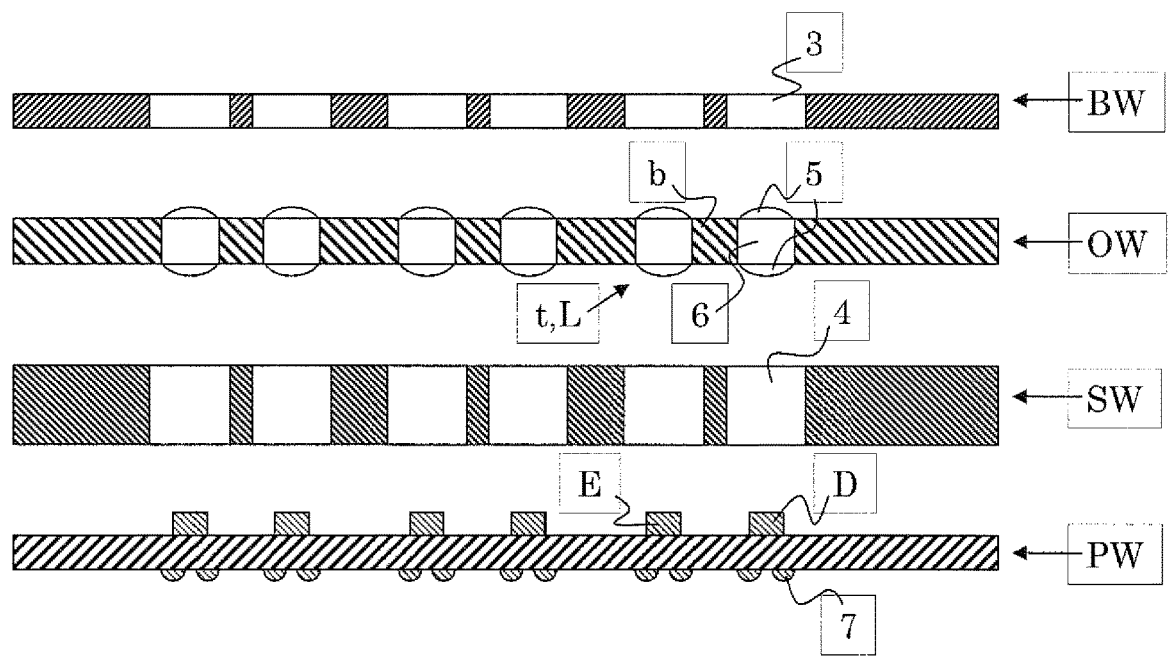
FIG. 3 a cross-sectional view of wafers for forming a wafer stack for manufacturing a multitude of modules of FIG. 1.

FIG. 3 shows a schematical cross-sectional view of wafers for forming a wafer stack for manufacturing a multitude of modules as shown in FIG. 1. It is possible to manufacture such modules 1 (practically) completely on wafer-scale, of course with a subsequent separation step. Although FIGS. 3 and 4 only show provisions for three modules 1, there can be in one wafer stack provisions for at least 10, rather at least 30 or even more than 50 modules in each lateral direction. Example dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

Four wafers are sufficient for manufacturing a multitude of modules as shown in FIG. 1: A substrate wafer PW, a spacer wafer SW, an optics wafer OW and a baffle wafer BW. Each wafer comprises a multitude of the corresponding members comprised in the corresponding module 1 (cf. FIGS. 1 and 2), arranged, for example, on a rectangular lattice, e.g., with a little distance from each other for a wafer separation step.

Substrate wafer PW can be a PCB assembly comprising a PCB of standard PCB materials, provided with solder balls 7 on the one side and with active optical components (E and D) soldered to the other side. The latter can be placed on substrate wafer PW by pick-and-place using standard pick-and-place machines.

In order to provide maximum protection from detecting undesired light, all wafers PW, SW, OW, BW can substantially be made of a material substantially non-transparent for light detectable by detecting members D, of course except for transparent areas such as transparent portions t and transparent regions 3.

Wafers SW and BW and possibly also all or a portion of wafer OW can be produced by replication. In an exemplary replication process, a structured surface is embossed into a liquid, viscous or plastically deformable material, then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of optics wafer OW, replication or molding may be used for obtaining the non-transparent portions (blocking portions b). It would also be possible to provide holes, where transparent portions t are supposed to be, by drilling or by etching.

Subsequently, a so-obtained precursor wafer is provided with lens members L, so as to yield optics wafer OW. This may be accomplished by means of replication, e.g., forming lens members L as a unitary parts, e.g., as described in US 2011/0043923 A1. The lens members L can, however, also be manufactured starting from a semi-finished part being a wafer comprising transparent elements 6 within holes by which transparent portions t are defined. This can be particularly useful when the lens members L each describe at least one apex, and those apices are located outside a vertical cross-section of the optics wafer OW. Such a semi-finished part can be (as in the example shown in the figures) a flat disk-like wafer having no holes penetrating the wafer in the transparent portions t and having virtually no or only shallow surface corrugations, such surface corrugations being, for example, concave, i.e. not extending beyond the wafer surface as described by the blocking portions b.

A semi-finished part like that can be obtained starting from a flat precursor wafer (made, for example, of one material) having holes or openings where the transparent portions are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, e.g., using a squeegee process (e.g. as known from screen printing) or a dispenser with several hollow needles outputting material. During the dispensing, the wafer can be placed on a flat support plate, e.g., made of a silicone. Care has to be taken order to prevent the formation of air bubbles or cavities in the dispensed material, since this would degrade the optical properties of the lens members L to be produced. E.g., one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain a transparent element 6 having parallel surfaces adjusted to the wafer thickness. Then, by means of replication, lens elements 5 are applied, for example, to both sides (top and button side) of wafer OW. In case of concave meniscuses of the transparent elements, the replication can take place on these, wherein the amount of applied replication material might have to be adjusted accordingly.

As has already been mentioned, it is generally possible to provide that the spacer wafer SW and/or the baffle wafer BW are obsolete in the sense that a particular kind of optics wafer is provided. Namely an optics wafer ("combined optics wafer") which incorporates the features and functionalities of the spacer wafer SW and/or the baffle wafer BW. Producing such a "combined optics wafer" may be accomplished using a particular precursor wafer and, manufactured based thereon, a particular semi-finished part. Such a precursor wafer and semi-finished part, respectively, has at least one structured surface, having, for example, protrusions extending vertically beyond at least one of the two surfaces of transparent elements to be provided in precursor wafer and present in the semi-finished part, respectively.

Figure 5:
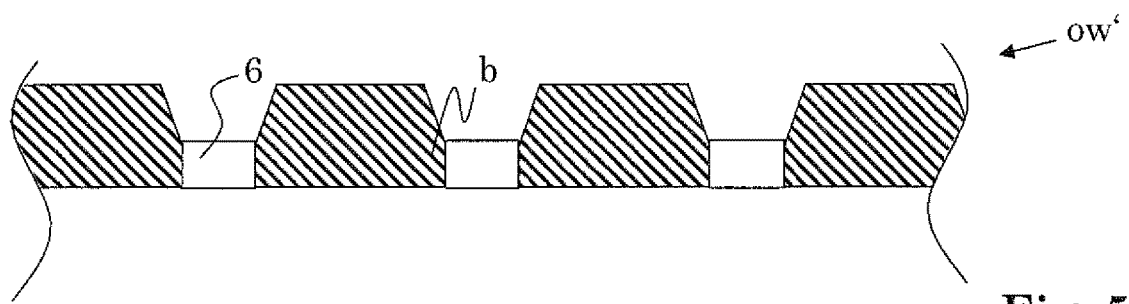
FIG. 5 a cross-sectional view of a semi-finished part having a structured surface.

In FIG. 5, an example of a semi-finished part ow' with one structured surface is schematically illustrated. This example for a semi-finished part ow' can be used for manufacturing an optics wafer ("combined optics wafer") and can be understood as a combination of an optics wafer OW and a spacer wafer SW.

Figure 6:
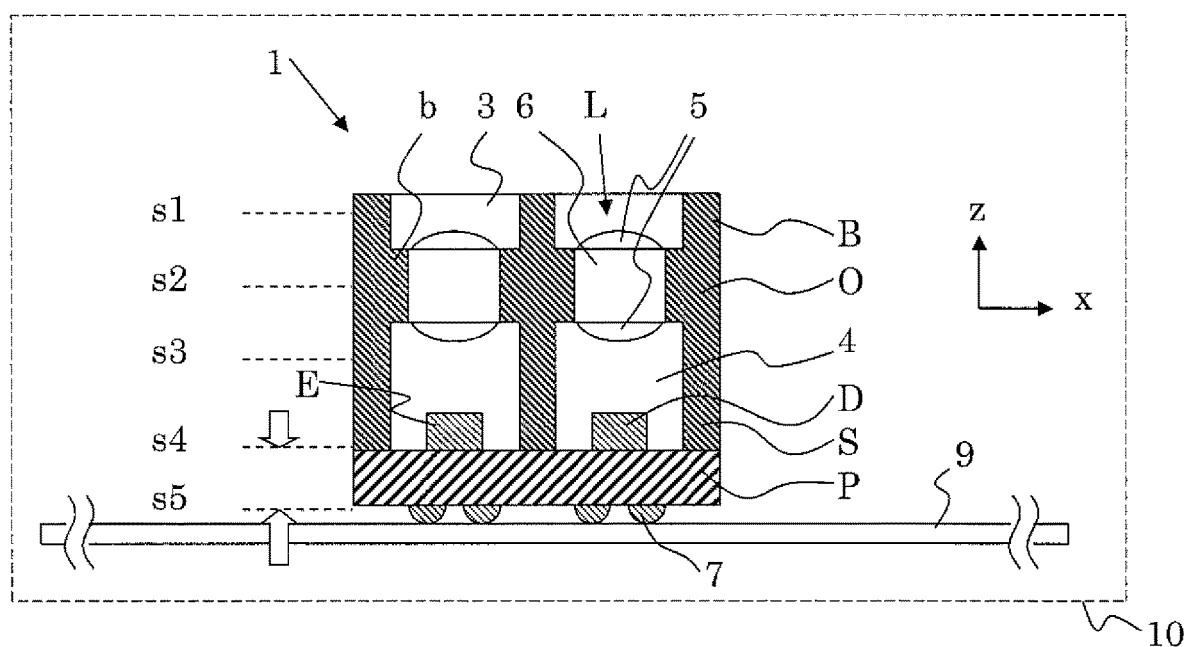
FIG. 6 a cross-sectional view of an opto-electronic module comprising a combined optics member comprising a separation member and a baffle member.

It is readily deduced from FIG. 5, what a semi-finished part could look like when it would be used for manufacturing a module shown in FIG. 1. Looking upon wafers OW and SW (or wafers OW and BW, or wafers OW and SW and BW) in FIG. 4 as one single part it can be readily visualized what a corresponding optics wafer ("combined optics wafer") for manufacturing a module according to FIG. 1 and also a corresponding semi-finished part would look like. FIG. 6 schematically illustrates, a cross-sectional view of an opto-electronic module comprising a combined optics member. This opto-electronic module corresponds to the one of FIG. 1, only neither separation member S nor baffle member B are separate from optics member O. They are both comprised in optics member O. Separation member S and baffle member B can both be manufactured together, in a single process, with blocking portion b of optics member O.

In order to form a wafer stack 2, the wafers are aligned and bonded together, e.g., by gluing, e.g., using a heat-curable epoxy resin. Each active optical component (such as detecting members D and emission members E on the substrate wafer PW) should be sufficiently accurately allocated with a corresponding passive optical component (such as lens members L of the optics wafer OW).

Figure 4:
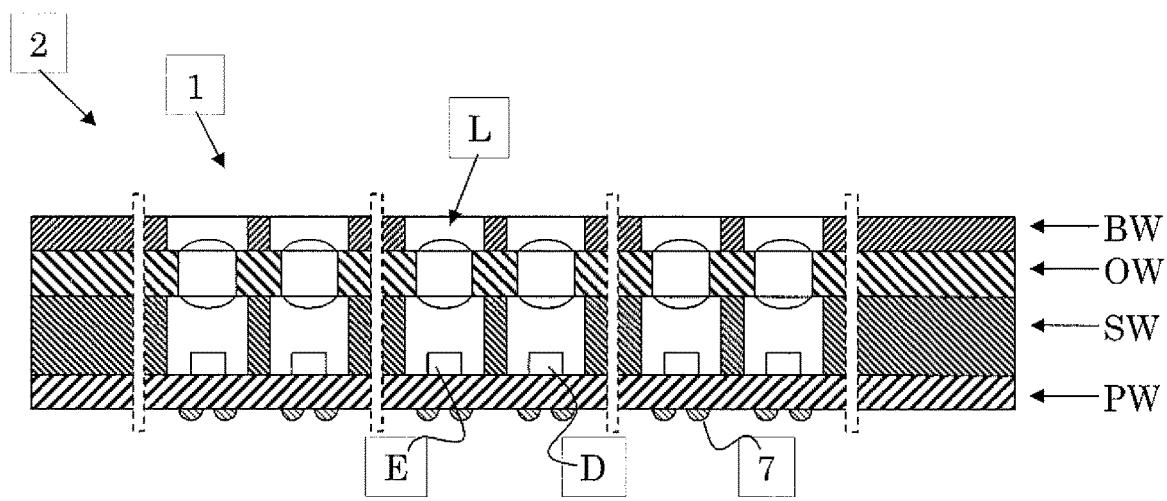
FIG. 4 a cross-sectional view of a wafer stack for manufacturing a multitude of modules of FIG. 1.

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw.

The fact that most alignment steps are carried out on wafer level makes it possible to achieve a good alignment (in particular of members D and E with respect to members L) in a rather simple and very fast way. The overall manufacturing process is very fast and precise. Due to the wafer-scale manufacturing, only a very small number of production steps is required for manufacturing a multitude of modules 1.

Other implementations are within the scope of the claims.

LIST OF REFERENCE SYMBOLS 1 opto-electronic module, proximity sensor
2 wafer stack
3 transparent region
4 opening
5 optical structure, lens element
6 transparent element
7 solder ball
9 printed circuit board
10 electronic device, smart phone
b blocking portion, non-transparent portion
B baffle member
BW baffle wafer
D detecting member, detector, photo diode
E emission member, light emitter, light-emitting diode
L passive optical component, lens member
O optics member
ow' semi-finished part
OW optics wafer
P substrate
PW substrate wafer
s1,s2, . . . refers to a sectional view
S separation member
SW spacer wafer
t transparent portion

What is claimed is:

1. An opto-electronic module comprising:
    a substrate;
    a planer optics member having a plate-like shape arranged parallel to said substrate; and
    a detecting member arranged between said substrate and said optics member, said detecting member mounted on said substrate for detecting light having passed through said optics member;
    wherein said optics member includes a transparent portion transparent for light detectable by said detecting member and aligned with the detecting member and at least one blocking portion composed of a polymer material for substantially attenuating or blocking incident light detectable by said detecting member, wherein said blocking portion surrounds the transparent portion;
    wherein the transparent portion includes a first lens element on a side of the optics member facing towards the substrate and a second lens element on a side of the optics member facing away from the substrate, the first lens element protruding from a first planar surface of the planar optics member and the second lens element protruding from a second planar surface of the planar optics member opposite of the first planar surface of the planar optics member; and
    wherein the blocking portion extends between the first and second planar surfaces of the optics member.

2. The module according to claim 1 comprising a separation member arranged between said substrate and said optics member;
    wherein said separation member is comprised in said optics member or is separate therefrom.

3. The module according to claim 2 wherein said substrate and said separating member are of block- or plate-like shape, at least said separating member having at least one hole.

4. The module according to claim 2 wherein said optics member and said separation member are combined in one member.

5. The module according to claim 4 wherein said at least one blocking portion and said separation member are manufactured as a unitary part.

6. The module according to claim 2 wherein lateral dimensions of said substrate, said optics member, and said separation member are substantially identical.

7. The module according to claim 2 wherein said separation member is made of a material which substantially attenuates or blocks light detectable by said detecting member.

8. The module according to claim 2 wherein said separation member is at least one of made of a hardened hardenable material and obtained using a replication process.

9. The module according to claim 1, wherein said first and second lens elements are hardened hardenable material and are obtained using a replication process.

10. The module according to claim 1 wherein said substrate provides at least one electrical connection from said detecting member across said substrate.

11. The module according to claim 1 wherein said substrate is a printed circuit board assembly.

12. The module according to claim 1 wherein the module is a proximity sensor.

13. An appliance including a multitude of the modules according to claim 1, the appliance including a substrate wafer and an optics wafer, wherein the substrates of the multitude of the modules are comprised in said substrate wafer and the optics members of the multitude of the modules are comprised in said optics wafer.

14. The appliance according to claim 13, the appliance including a spacer wafer, wherein a multitude of separation members are comprised in said spacer wafer.

15. An electronic device comprising:
a printed circuit board, and
a module according to claim 1 mounted on said printed circuit board.

16. The device according to claim 1, wherein the device is a hand-held communication device.

17. The module according to claim 1 further comprising an emission member arranged between the substrate and the optics member, the emission member being mounted on the substrate for emitting light detectable by the detecting member;
wherein the optics member includes a second transparent portion transparent for light emitted by said emission member and aligned with the emission member; and
wherein the blocking portion surrounds and separates the transparent portion aligned with the detecting member and the second transparent portion.

18. The module according to claim 17 further comprising a separation member arranged between said substrate and said optics member,
wherein said separation member is comprised in said optics member or is separate therefrom, and
wherein at least a portion of said separation member is arranged between said emission member and said detecting member for reducing optical cross-talk between said emission member and said detecting member.

19. The module according to claim 17 further comprising a separation member arranged between said substrate and said optics member,
wherein said separation member is comprised in said optics member or is separate therefrom,
wherein said detecting member is encircled by said separating member, and
wherein said emission member is encircled by said separating member.

20. The module according to claim 17, wherein said emission member, said optics member, and said detecting member are structured and arranged such, that when light emitted from said emission member having passed said at least one transparent portion and having been reflected by a surface located outside the module and having passed said at least one transparent portion again is detected by said detecting member, an amount of so-detected light depends on a distance of said surface to said optics member.

21. A proximity sensor comprising:
a substrate;
a planer optics member having a plate-like structure and arranged parallel to said substrate;
a detecting member arranged between said substrate and said optics member, mounted on said substrate, for detecting light having passed through said optics member;
an emission member arranged between said substrate and said optics member, mounted on said substrate, for emitting light detectable by said detecting member; and
a separation member arranged between said substrate and said optics member, wherein said separation member is comprised in said optics member or is separate therefrom, and wherein said separation member is made of a material which substantially attenuates or blocks light detectable by said detecting member;
wherein said planer optics member includes
a first transparent portion transparent for light emitted by said emission member and aligned with the emission member and a second transparent portion transparent for light detectable by said detecting member and aligned with the detecting member, and
at least one blocking portion composed of a polymer material for substantially attenuating or blocking incident light detectable by said detecting member, wherein said blocking portion surrounds and separates said first transparent portion and said second transparent portion;
wherein at least one selected from a group consisting of the first transparent portion and the second transparent portion includes a first lens element on a side of the optics member facing towards the substrate and a second lens element on a side of the optics member facing away from the substrate, the first lens element protruding from a first planar surface of the planar optics member and the second lens element protruding from a second planar surface of the planar optics member opposite of the first planar surface of the planar optics member; and
wherein the blocking portion extends between the first and second planar faces of the optics member.

22. The proximity sensor according to claim 21 wherein lateral dimensions of said substrate, said optics member, and said separation member are substantially identical.

23. The proximity sensor according to claim 21 wherein at least a portion of said separation member is arranged between said emission member and said detecting member for reducing optical cross-talk between said emission member and said detecting member.

24. The proximity sensor according to claim 21 wherein said substrate provides at least one electrical connection from said detecting member across said substrate.

25. The proximity sensor according to claim 21 wherein said emission member, said optics member and said detecting member are structured and arranged such, that when light emitted from said emission member having passed said at least one transparent portion, and having been reflected by a surface located outside the module, and having passed said at least one transparent portion again is detected by said detecting member, an amount of so-detected light depends on a distance of said surface to said optics member.

* * * * *